United States Patent
Alves et al.

(10) Patent No.: US 9,136,019 B1
(45) Date of Patent: Sep. 15, 2015

(54) BUILT-IN TESTING OF UNUSED ELEMENT ON CHIP

(71) Applicant: International Business Machines Corporation, Armonk, NY (US)

(72) Inventors: Luiz C. Alves, Hopewell Junction, NY (US); William J. Clarke, Poughkeepsie, NY (US); Christopher R. Conklin, Stone Ridge, NY (US); William V. Huott, Holmes, NY (US); Kevin W. Kark, Poughkeepsie, NY (US); Thomas J. Knips, Wappingers Falls, NY (US); K. Paul Muller, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 14/205,724

(22) Filed: Mar. 12, 2014

(51) Int. Cl.
| | |
|---|---|
| G11C 7/00 | (2006.01) |
| G11C 29/44 | (2006.01) |
| G11C 29/08 | (2006.01) |
| G11C 29/12 | (2006.01) |
| G11C 29/50 | (2006.01) |
| G11C 29/00 | (2006.01) |

(52) U.S. Cl.
CPC .............. G11C 29/44 (2013.01); G11C 29/08 (2013.01); G11C 29/12 (2013.01); G11C 29/50 (2013.01); G11C 29/785 (2013.01)

(58) Field of Classification Search
CPC .... G11C 29/4401; G11C 29/32; G11C 29/44; G11C 2029/3602; G11C 29/24; G11C 29/26; G11C 2029/4402; G11C 2029/0401; G11C 29/12; G11C 29/785; G11C 29/08; G11C 29/50; G11C 16/3495; G11C 2229/743; H01L 2924/1436; H01L 2924/1437; H01L 2924/1434
USPC ................................ 365/185.02, 185.09, 201
See application file for complete search history.

(56) References Cited

U.S. PATENT DOCUMENTS

| | | | |
|---|---|---|---|
| 6,181,614 B1 | 1/2001 | Aipperspach et al. | |
| 7,472,320 B2 | 12/2008 | Berndlmaier et al. | |
| 7,770,067 B2 | 8/2010 | Lockwood et al. | |
| 7,793,173 B2 | 9/2010 | Chang et al. | |
| 7,840,916 B2 | 11/2010 | Hsu et al. | |
| 2014/0032986 A1* | 1/2014 | Wan et al. | 714/727 |

* cited by examiner

Primary Examiner — Fernando Hidalgo
(74) Attorney, Agent, or Firm — Cantor Colburn LLP; Margaret McNamara (57) ABSTRACT

Embodiments relate to built-in testing of an unused element on a chip. An aspect includes concurrently performing on a chip comprising a plurality of chip elements comprising a plurality of active elements, each active element enabled to perform a respective function, and at least one unused element that is disabled from performing the respective function and configured to be selectively enabled as an active element, the respective functions of the respective active elements and a built-in self test (BIST) test of the at least one unused element. Another aspect includes inputting an input test pattern to the unused element. Another aspect includes receiving an output test pattern based on the input test pattern from the unused element. Another aspect includes comparing the input test pattern to the output test pattern. Another aspect includes determining whether the unused element passed or failed the testing based on the comparison.

9 Claims, 6 Drawing Sheets

BUILT-IN TESTING OF UNUSED ELEMENT ON CHIP

BACKGROUND

The present invention relates generally to computer systems, and more specifically, to built-in testing of an unused element on a chip in a computer system.

An additional amount of margin may be added to the performance criteria of a semiconductor chip during testing at the end of the manufacturing process, as the chip may be negatively influenced by degradation of performance. However, the chip will only need the added margin if critical path(s) are negatively affected, which does not always occur. Therefore, in the absence of degradation in the semiconductor chip, the added margin may comprise one or more unused elements on the chip.

Solid state memory arrays are frequently used in computers and other electronic devices where fast access times are desired. For example, solid state memory arrays are often used as the main working storage repository for a computer, as well as in higher speed cache memories, implemented either separate from or in the same integrated circuit device as the principal processing circuitry for the computer.

Solid state memory arrays are typically implemented on a semiconductor integrated circuit device using multiple memory cells assigned to different memory addresses and arranged together with support circuitry suitable for accessing specific memory cells in the array. Due to processing variations that are inherent in all semiconductor manufacturing processes, it is not uncommon for one or more memory cells in a manufactured memory array to be faulty, and thus be incapable of reliably storing information. While a memory array may contain thousands or millions of memory cells, if even one memory cell in the memory array is faulty, the entire memory array is essentially unusable.

To address this concern, a portion of the memory cells in many memory array designs are designated as "redundant" memory cells that are selectively used to repair the memory arrays whenever primary memory cells are found to be faulty. Typically, such repairs are made by selectively activating fuses disposed on the same integrated circuit device as a memory array. Often, a fuse is implemented as a conductive interconnect that is selectively (and permanently) broken using a laser or an excessive electrical current. The fuse is coupled to routing logic for the memory array, such that, when the fuse conducts, a primary memory cell, or bank of primary memory cells, are accessed whenever a specific memory address associated with such a cell is requested. However, whenever the fuse is broken, the routing logic will instead access a redundant memory cell, or bank of redundant memory cells, in place of the primary memory cell(s) associated with that memory address.

Through the use of redundant memory cells, the manufacturing yield of semiconductor devices incorporating memory arrays can be significantly improved, since memory arrays containing relatively minor faults can be repaired, rather than having to be completely scrapped. Particularly when a memory array is integrated onto the same integrated circuit device as a complex and expensive logic circuit (e.g., as a level one cache for use with a microprocessor core), the cost savings associated with fuse-based repairs can be substantial. If such a repair is carried out after the semiconductor device is delivered to the field, the longevity of the semiconductor devices may be enhanced. This redundancy is not limited to just memory cells. There may be redundant processor units, redundant memory arrays, entire redundant processor cores, or other redundant elements on a chip. A primary, now defective element may be deactivated through a logical masking process and become a masked element.

SUMMARY

Embodiments include a method, system, and computer program product for built-in testing of an unused element on a chip. An aspect includes concurrently performing on a chip comprising a plurality of chip elements comprising a plurality of active elements, each active element enabled to perform a respective function, and at least one unused element that is disabled from performing the respective function and configured to be selectively enabled as an active element, the respective functions of the respective active elements and a built-in self test (BIST) test of the at least one unused element. Another aspect includes inputting an input test pattern to the unused element. Another aspect includes receiving an output test pattern based on the input test pattern from the unused element. Another aspect includes comparing the input test pattern to the output test pattern. Another aspect includes determining whether the unused element passed or failed the testing based on the comparison.

BRIEF DESCRIPTION OF THE SEVERAL VIEWS OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

Embodiments of built-in testing of an unused element on a chip are provided, with exemplary embodiments being discussed below in detail. An unused element may comprise any logically unavailable element on the chip, such as a masked element or a redundant element, that is not enabled to perform the element's desired function. Defects, such as power to ground shorts, can occur during manufacturing of a semiconductor chip. Such a defect may be concealed by a masking operation in which the element (for example, a memory array or a processor) on the chip in which the defect is located is logically deactivated. A repair operation may also be performed, in which an equivalent, redundant element on the chip may be activated to replace the masked element. However, the masking and repair do not remove the short that is the root cause of the defect. During operation of the chip, the masked element that contains the short is powered on with the rest of the chip. In some cases, this leads to a constant current and a tolerable local heating. However, in other cases, the power to ground short may become worse during operation and cause electromigration in the chip during operation. This electromigration may cause secondary defects, such as metal extrusions that may contact neighboring power lines causing further, larger power to ground shorts in the chip, ultimately leading to catastrophic failure of the chip. Therefore, monitoring of trends in masked elements on a chip may be performed during operation of the chip to determine whether a secondary defect is developing in a masked element. An increase in currents or local temperatures is of interest, as are other factors such as an increase in the number of failing bits, a reduction in read or write margin, or an increase in voltage drop. Since different wear mechanisms apply to currently unused redundant elements, similar monitoring may also performed on the non-defective, but currently unused, redundant elements on the chip.

The chip may comprise a memory chip or a processor chip in various embodiments, and the chip elements may comprise individually addressable memory arrays or individual processor cores in various embodiments. The monitoring may be performed by built-in self-test (BIST) engines that are built into the chip, such as Array BIST (ABIST) or Logic BIST (LBIST) engines, which are controlled by firmware. A chip may comprise a plurality of BIST engines, each of which monitors a subset of the elements on the chip. These BIST engines may determine the number of correctable errors (CEs) and uncorrectable errors (UEs) as well as fail rate trends and other trends in the masked and redundant elements on the chip. Determination that a masked element has failed the testing may trigger replacement of the chip. In the event of a test failure by a redundant element, masking of the redundant element may be triggered by the determination of test failure. In some embodiments, if a redundant element passes the error testing by the BIST, the redundant element may be replace an active element on the chip in order to spread wear among available elements on the chip; the active element that is replaced becomes a redundant element. The testing may comprise inputting a bit pattern into the element that is being tested by the BIST engine; outputting the bit pattern by the element under test to the BIST engine, and comparing the input bit pattern to the output bit pattern by the BIST engine to determine any bit flips that occurred in the element under test. A BIST engine may repeat the testing of its respective masked and redundant elements at any appropriate interval. The test results may be stored; in some embodiments, current test results are compared to stored test results to determine a rate of element deterioration. In such embodiments, if there is an increase in the error rate that is above a set threshold, the element is determined to have failed the testing. In other embodiments, the current test results are compared to a threshold to determine whether the element has passed or failed the testing.

The periodic testing of masked and redundant elements by the BIST engines may cause increased current and temperatures in the chip; therefore, the testing by the BIST engines may be performed in a throttled fashion. The periodicity of the testing by the BIST engines may be from about 100 milliseconds to in the range of a few minutes in some embodiments; however, testing may be performed with any appropriate periodicity in various embodiments. The testing is performed concurrently with performing the desired function of the active elements on the chip on which the BIST engine is located in order to, for example, execute an application using the chip. Only the unused, e.g. redundant and/or masked, portions of the chip are tested. In some embodiments, a redundant element that passes testing may replace an active element on the chip, and the active element may become a redundant element, in order to spread wear among the available elements on the chip.

Figure 1:
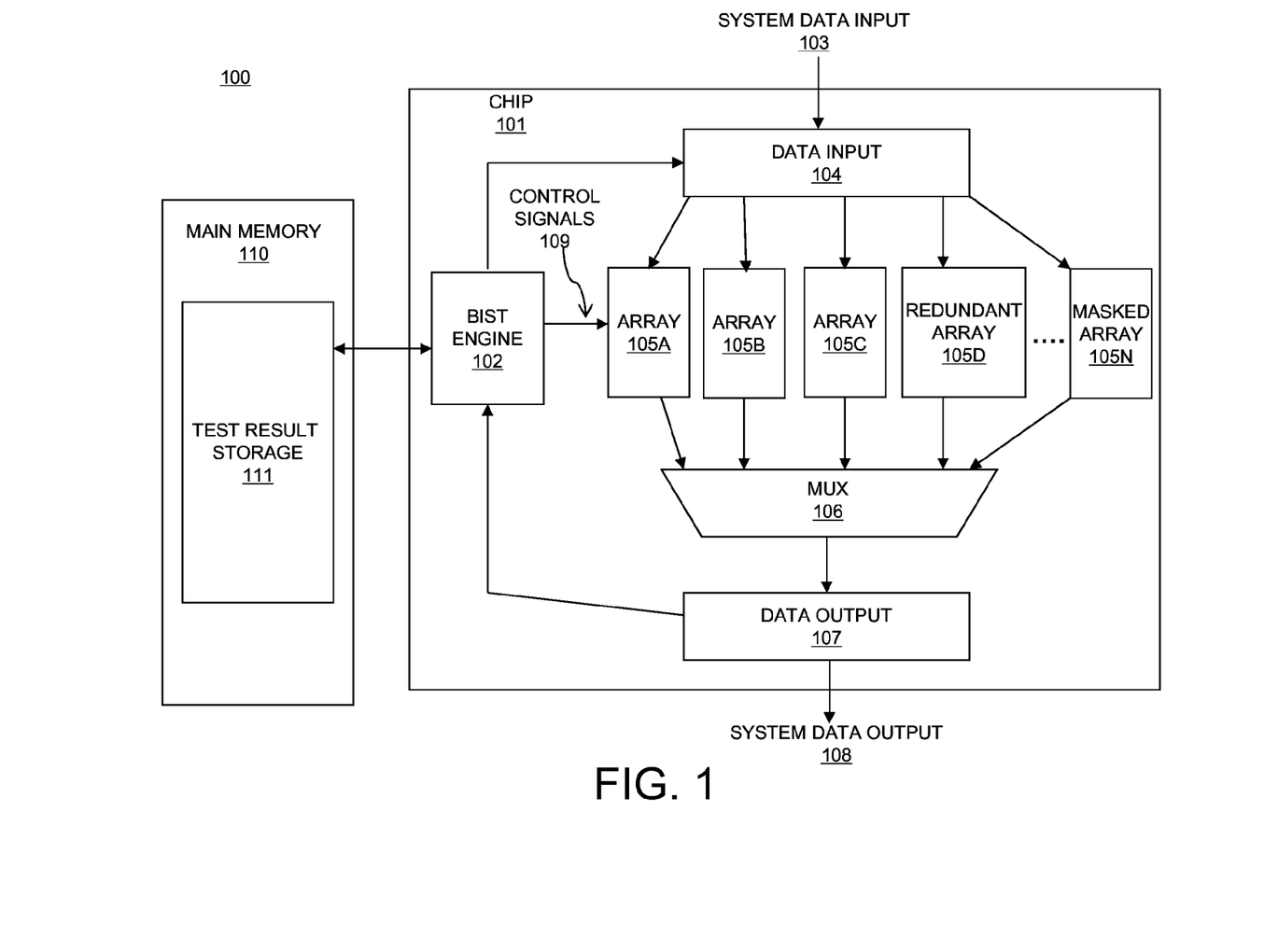
FIG. 1 depicts a block diagram of a system for built-in testing of an unused element on a chip in accordance with an embodiment.

Turning now to FIG. 1, an embodiment of a system 100 for built-in testing of an unused element on a chip is generally shown. System 100 comprises a chip 101 that includes a plurality of elements comprising memory arrays 105A-N. The chip 101 may comprise part of a cache memory of a computer system in which system 100 is located; in such embodiments, chip 101 may comprise, for example, an embedded dynamic access memory (EDRAlVI) chip, or a static random access memory (SRAM) chip. The memory arrays 105A-N each comprise individually addressable memory areas in the chip 101. One or more of the memory arrays 105A-N may be masked, such as masked array 105N. Further, one or more of the memory arrays 105A-N may comprise a redundant memory array, such as redundant array 105D. The remaining memory arrays, such as memory arrays 105A-C, are active memory arrays. In some embodiments, a redundant memory array element is also masked; the redundant memory array element is unmasked when it is used to replace an active memory array element, in which case the formerly redundant memory array becomes an active memory array, and the formerly active memory array that was replaced is marked off and isolated as a masked array. Masked array 105N is logically unavailable during operation of the chip 101 and is not used by the chip 101 during operation. The masked array 105N and the redundant array 105D receive power during operation of chip 101. During normal operation of the chip 101, data is input into the chip 101 from the computer system in which chip 101 is located via system data input 103, and the data input module 104 stores the input data into the non-masked memory arrays, such as memory arrays 105A-D. Data is read out of the non-masked memory arrays 105A-D via multiplexer (MUX) 106 and data output module 107, and output back to the computer system in which chip 101 is located via system data output 108.

The BIST engine 102 periodically tests redundant array 105D (if redundant array 105D is unused) and masked array 105N during operation of chip 101. During testing, the BIST engine inputs a test pattern (i.e., a bit sequence having any appropriate length) that is stored in the element under test (e.g., redundant array 105D or masked array 105N) via data input module 104, and then reads the stored test pattern out of the element under test via MUX 106 and data output module 107. The BIST engine 102 compares the input test pattern to the output test pattern, and determines an error rate (i.e., bit flips) that occurred in the element under test based on the comparison. In some embodiments, the error rate is compared to a threshold error rate by the BIST engine 102 in order to determine whether the element under test has passed or failed. In other embodiments, the results of the test, including an element identifier, a time stamp, and the error rate, are stored by BIST engine 102 in test result storage 111, and the error rate of the current testing is compared to a stored error rate from past testing to determine a rate of deterioration of the element under test. The determined rate of deterioration is compared to a threshold to determine whether the element under test has failed the testing. The test result storage 111 may be located in a main memory 110 of the computer system in which chip 101 is located. BIST engine 102 may transmit control signals 109 to the memory arrays 105A-N as needed during testing. Different thresholds may be set in the BIST engine 102 for masked arrays versus redundant arrays. The testing is described in further detail below with respect to FIGS. 4-5. FIG. 1 is shown for illustrative purposes only; a chip 101 may include any appropriate number of memory arrays, and any appropriate number of these memory arrays may comprise masked arrays and/or redundant arrays.

Figure 2:
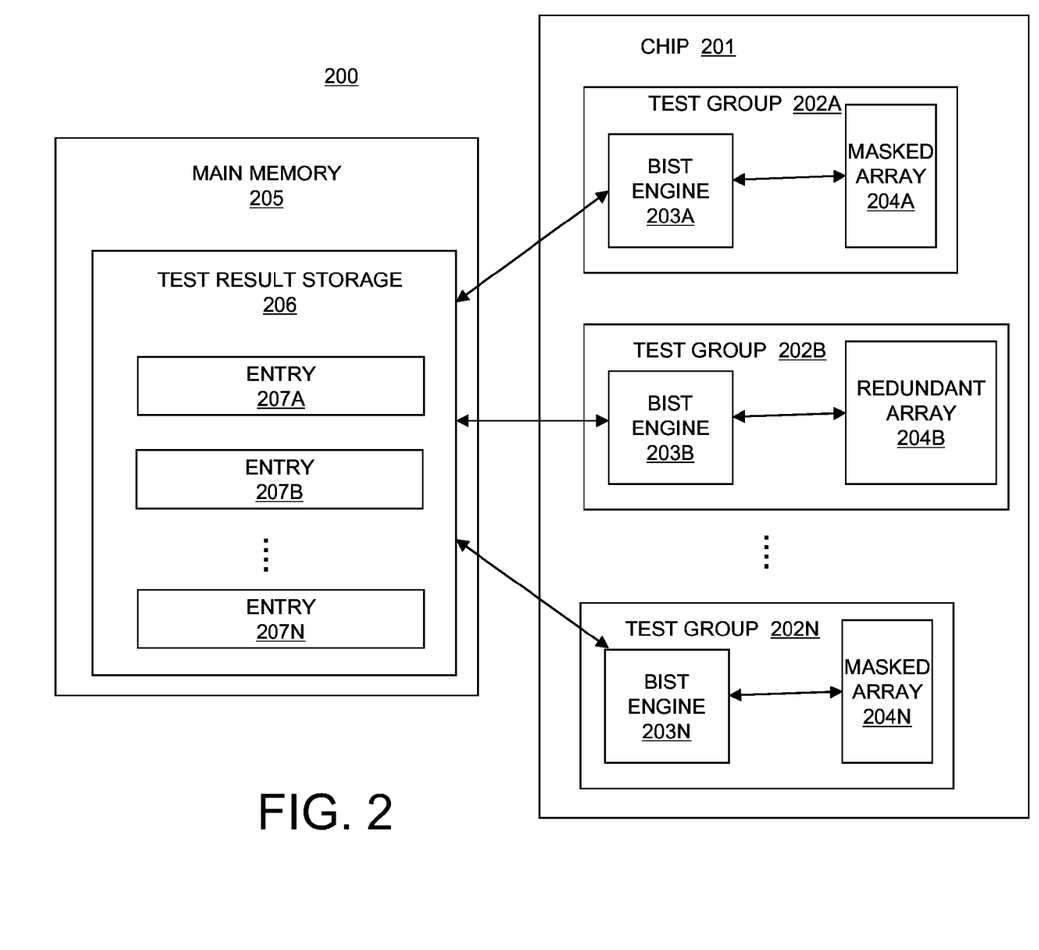
FIG. 2 depicts a block diagram of another system for built-in testing of an unused element on a chip in accordance in accordance with an embodiment.

FIG. 2 illustrates another embodiment of a system 200 for built-in testing of an unused element on a chip. System 200 comprises a chip 201 that includes a plurality of elements comprising memory arrays that are divided into test groups 202A-N; a test group such as each of test groups 202A-N comprises a plurality of memory arrays, such as were shown with respect to memory arrays 105A-N of FIG. 1. Each test group of test groups 202A-N may comprise one or more masked arrays, such as masked arrays 204A and 204 N, and/or redundant arrays, such as redundant array 204B, which are logically unavailable and not used during operation of the chip 201, but are powered on. Each test group of test groups 202A-N has a respective BIST engine 203A-N. The chip 201 may comprise part of a cache memory of a computer system in which system 200 is located; in such embodiments, chip 201 may comprise, for example, EDRAM or SRAM. The BIST engines 203A-N may comprise ABIST engines or a LBIST engines in various embodiments. Each of BIST engines 203A-N periodically test the masked and/or redundant memory arrays in the BIST engine's respective test group 202A-N, including masked arrays 204A and 204N, and redundant array 204B, during operation of chip 201. The testing is described in further detail with respect to FIGS. 4-5. In some embodiments, test results are stored in test result storage 206 in main memory 205. The test results in test result storage 206 may each comprise an entry 207A-N comprising an element identifier, a timestamp, and an error rate entry. FIG. 2 is shown for illustrative purposes only; a chip 201 may include any appropriate number of memory arrays divided into any appropriate number of test groups, and any appropriate number of these memory arrays within the test groups may comprise masked arrays or redundant arrays. Further, a chip 201 may include any appropriate number of test groups having respective BIST engines. Any appropriate number of entries may be stored in test result storage 206, and, in some embodiments, test result storage 206 may be omitted.

Figure 3:
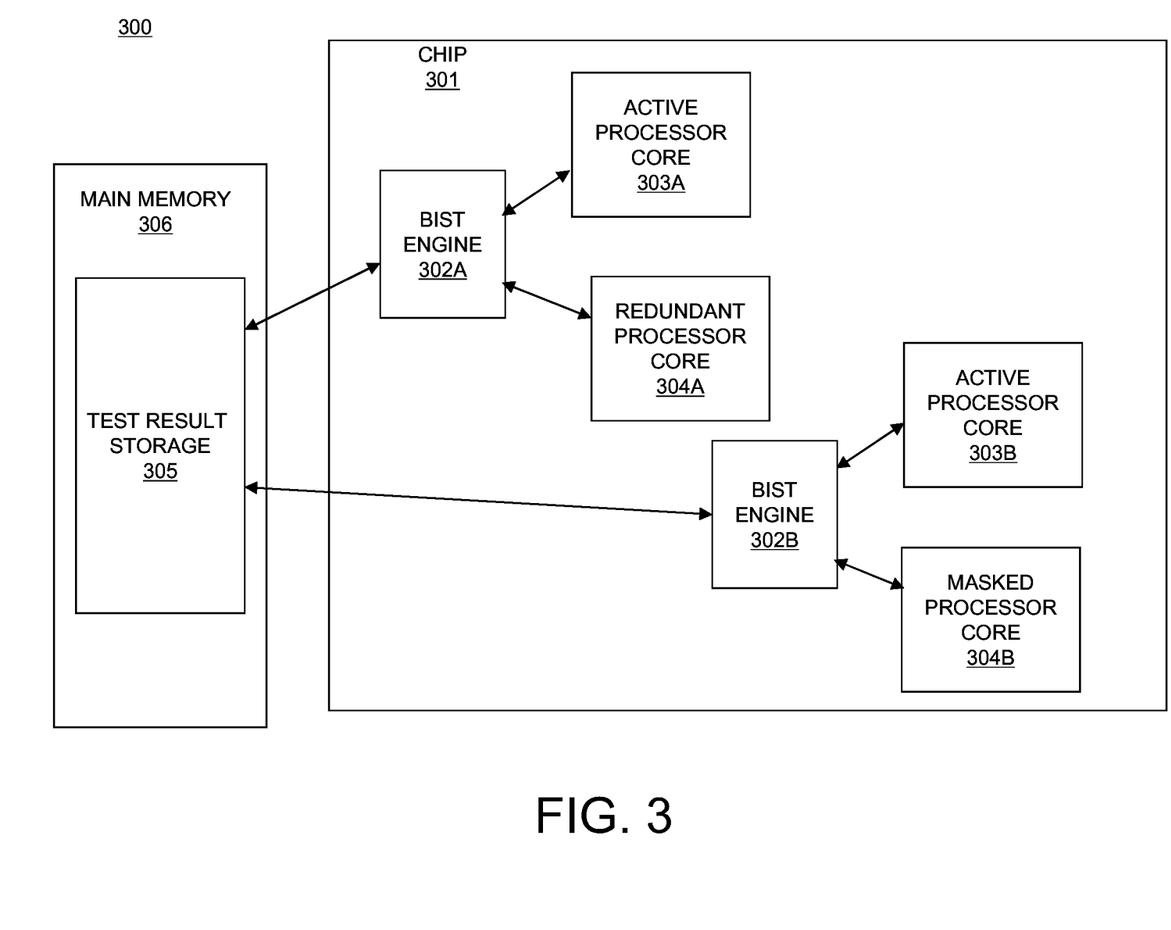
FIG. 3 depicts a block diagram of another system for built-in testing of an unused element on a chip in accordance in accordance with an embodiment.

FIG. 3 illustrates another embodiment of a system 300 for built-in testing of an unused element on a chip. System 300 comprises a chip 301 that includes a plurality of elements comprising processor cores, including active processor cores 303A-B, redundant processor core 304A, and masked processor core 304B. Processor cores 303A-B are in use by the computer system in which chip 301 is located during operation, while redundant processor core 304A and masked processor core 304B are logically unavailable and are not in use, but are powered on, during normal operation of the chip 301. Chip 301 further comprises one or more BIST engines such as BIST engines 302A-B. The BIST engines 302A-B may comprise ABIST engines or a LBIST engines in various embodiments. BIST engines 302A-N are each assigned to a group of processor cores on the chip 301, and periodically test their respective masked and/or redundant processor cores using, for example, a test pattern that is input to and then output from the processor core under test. In some embodiments, the test results determined by BIST engines 302A-B may be stored in test result storage 305 in main memory 306. The testing is described in further detail below with respect to FIGS. 4-5. FIG. 3 is shown for illustrative purposes only; a chip 301 may include any appropriate number of processor cores, and any appropriate number of these processor cores may comprise masked or redundant processors. Further, a chip 301 may include any appropriate number of BIST engines, and a BIST engine may be associated with any appropriate number of masked processor cores, redundant processor cores, and active processor cores on the chip 301.

Figure 4:
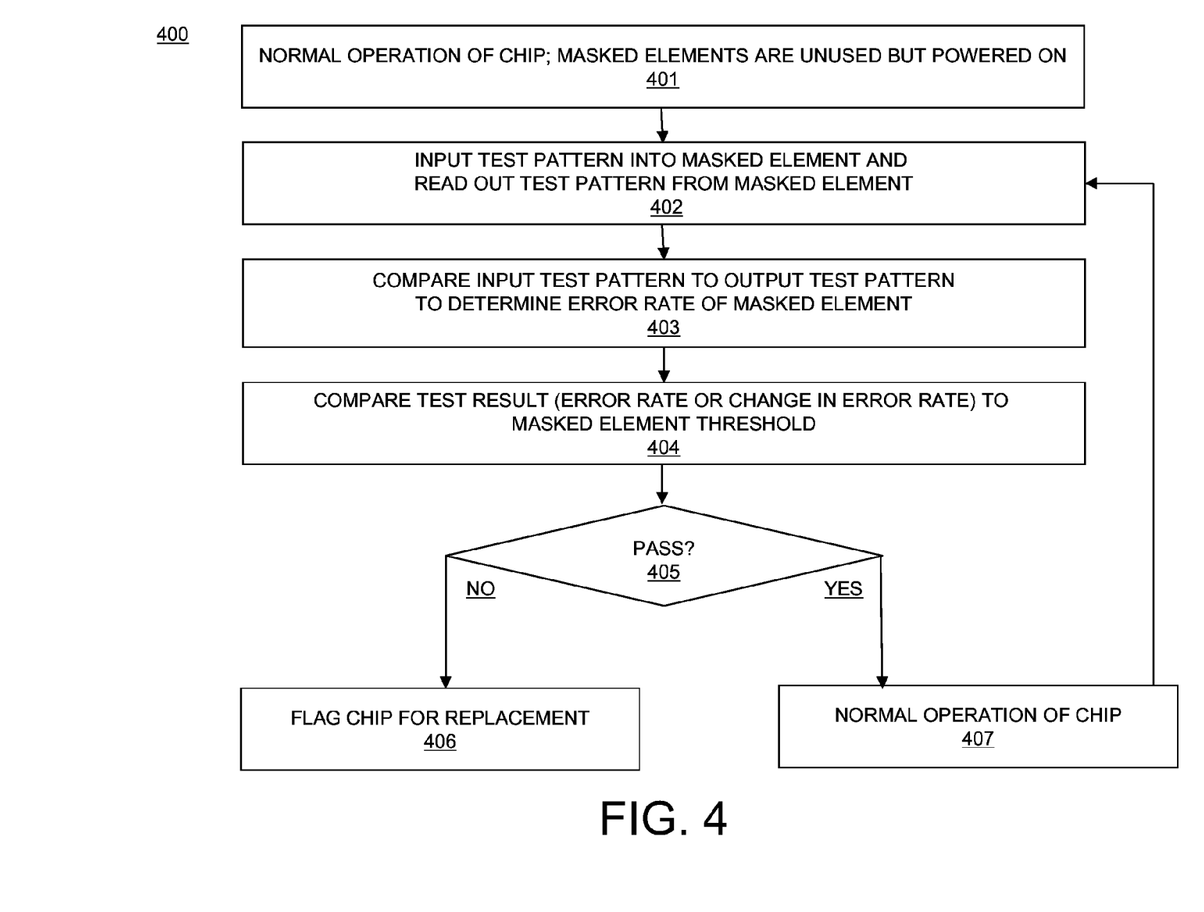
FIG. 4 depicts a process flow for built-in testing of a masked element on a chip in accordance with an embodiment.

FIG. 4 illustrates an embodiment of a method 400 of built-in testing of a masked element on a chip. Method 400 may be implemented in any of BIST engine 102 of FIG. 1; BIST engines 203A-N of FIG. 2, and BIST engines 302A-B of FIG. 3. Method 400 is performed concurrently with execution of applications by the computer system in which the chip is located, and is only performed on masked elements on the chip, so as not to interfere with the desired function of the active elements. First, in block 401, normal operation of a chip in a computing system occurs. The chip includes one or more masked elements that are not used, but are powered on, during operation of the chip. The masked element may comprise a memory array or a processor core in various embodiments (for example, masked array 105N, masked arrays 204A and 204N, or masked processor core 304B). Next, in block 402, the BIST engine on the chip that is assigned to the masked element tests the masked element by inputting a test pattern comprising a bit sequence from the BIST engine into the masked element, and receiving an output of the test pattern from the masked element. The test pattern may have any appropriate length. Then, in block 403, the BIST engine compares the input test pattern to the output test pattern to determine an error rate (e.g., a number of bit flips) of the masked element under test. Then, in block 404, the test results are compared to a masked element threshold. In some embodiments, the current error rate of the masked element that was determined in block 403 in the current iteration of method 400 is compared to one or more past error rates of the masked element that are stored in a test result storage (e.g., test result storage 111, test result storage 206, test result storage 305) to determine a rate of change of the error rate, and the determined rate of change of the error rate is compared to a threshold rate of change that is defined for masked elements in the BIST engine. In such an embodiment, the current error rate is also stored in the test result storage. In other embodiments, the current error rate is compared to an error rate threshold that is defined for masked elements in the BIST engine; in such an embodiment, the current error rate may not be stored. In block 405, it is determined whether the masked element passed the test based on the comparison of block 404 (i.e., whether the error rate or rate of change of the error rate is below the threshold in block 404). If it is determined in block 405 that the masked element did not pass the testing, flow proceeds from block 405 to block 406, in which the chip is flagged for replacement, and method 400 ends. If it is determined in block 405 that the masked element has passed the testing, flow proceeds from block 405 to block 407, in which normal operation of the chip resumes. Flow then proceeds from block 407 to block 402, in which the BIST engine repeats the testing of the masked element. Method 400 may be repeated with any appropriate periodicity during operation of the chip.

Figure 5:
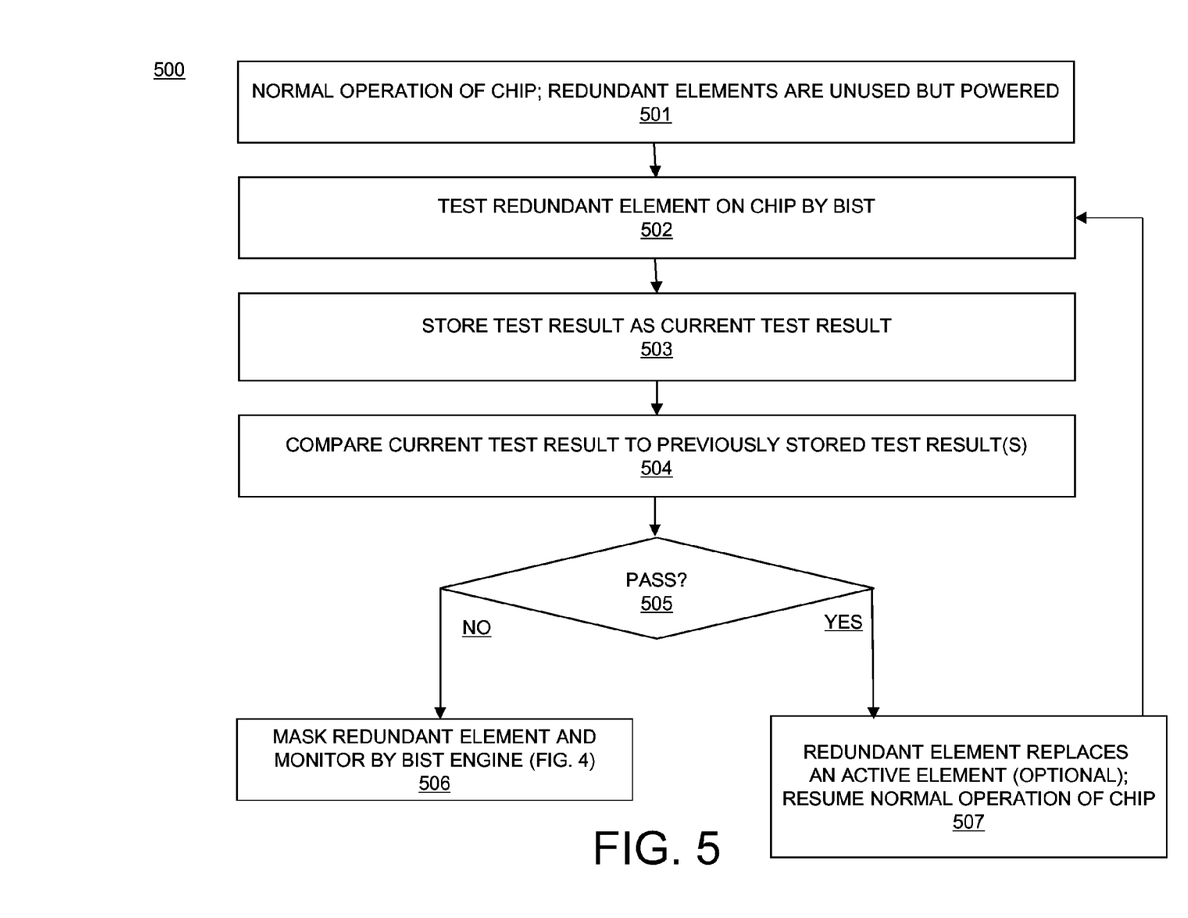
FIG. 5 depicts a process flow for built-in testing of a redundant element on a chip in accordance with an embodiment.

FIG. 5 illustrates an embodiment of a method 500 of built-in testing of a redundant element on a chip. Method 500 may be implemented in any of BIST engine 102 of FIG. 1; BIST engines 203A-N of FIG. 2, and BIST engines 302A-B of FIG. 3. Method 500 is performed concurrently with execution of applications by the computer system in which the chip is located, and is only performed on unused redundant elements on the chip, so as not to interfere with the desired function of the active elements. First, in block 501, normal operation of a chip in a computing system occurs. The chip includes one or more redundant elements that are not used, but are powered on, during operation of the chip. The redundant element may comprise a memory array or a processor core in various embodiments (for example, redundant array 105D, redundant array 204B, or redundant processor core 304A). Next, in block 502, the BIST engine on the chip that is assigned to the redundant element tests the redundant element by inputting a test pattern comprising a bit sequence from the BIST engine into the redundant element, and receiving an output of the test pattern from the redundant element. The test pattern may have any appropriate length. Then, in block 503, the BIST engine compares the input test pattern to the output test pattern to determine an error rate (e.g., a number of bit flips) of the redundant element under test. Then, in block 504, the test results are compared to a redundant element threshold. The redundant element threshold is a different value from the masked element threshold discussed above with respect to FIG. 4; for example, the redundant element threshold may be lower than the masked element threshold. In some embodiments, the current error rate of the redundant element that was determined in block 503 in the current iteration of method 500 is compared to one or more past error rates for the redundant element that are stored in a test result storage (e.g., test result storage 111, test result storage 206, test result storage 305) to determine a rate of change of the error rate, and the determined rate of change of the error rate is compared to a threshold rate of change that is defined for redundant elements in the BIST engine. In such an embodiment, the current error rate is also stored in the test result storage. In other embodiments, the current error rate is compared to an error rate threshold that is defined for redundant elements in the BIST engine; in such an embodiment, the current error rate may not be stored. In block 505, it is determined whether the redundant element passed the test based on the comparison of block 504 (i.e., whether the error rate or rate of change of the error rate was below the threshold in block 504). If it is determined in block 505 that the masked element did not pass the testing, flow proceeds from block 505 to block 506, in which the redundant element is masked, and method 500 ends. The newly masked redundant element is then monitored by the BIST engine using the method 400 of FIG. 4. If it is determined in block 505 that the redundant element has passed the testing, flow proceeds from block 505 to block 507, in which normal operation of the chip resumes. In some embodiments, based on passing the testing by the redundant element, the redundant element may be made an active element, and an active element on the chip may be made a redundant element, in order to spread wear of the chip among the available elements. Flow then proceeds from block 507 to block 502, in which the BIST engine repeats the testing of the redundant element. Method 500 may be repeated with any appropriate periodicity during operation of the chip.

Technical effects and benefits include prevention of catastrophic failure of a chip in the field.

As will be appreciated by one of average skill in the art, aspects of embodiments may be embodied as a system, method or computer program product. Accordingly, aspects of embodiments may take the form of an entirely hardware embodiment, an entirely software embodiment (including firmware, resident software, micro-code, etc.) or an embodiment combining software and hardware aspects that may all generally be referred to herein as, for example, a "circuit," "module" or "system." Furthermore, aspects of embodiments may take the form of a computer program product embodied in one or more computer readable storage device(s) having computer readable program code embodied thereon.

One or more of the capabilities of embodiments can be implemented in software, firmware, hardware, or some combination thereof. Further, one or more of the capabilities can be emulated.

Figure 6:
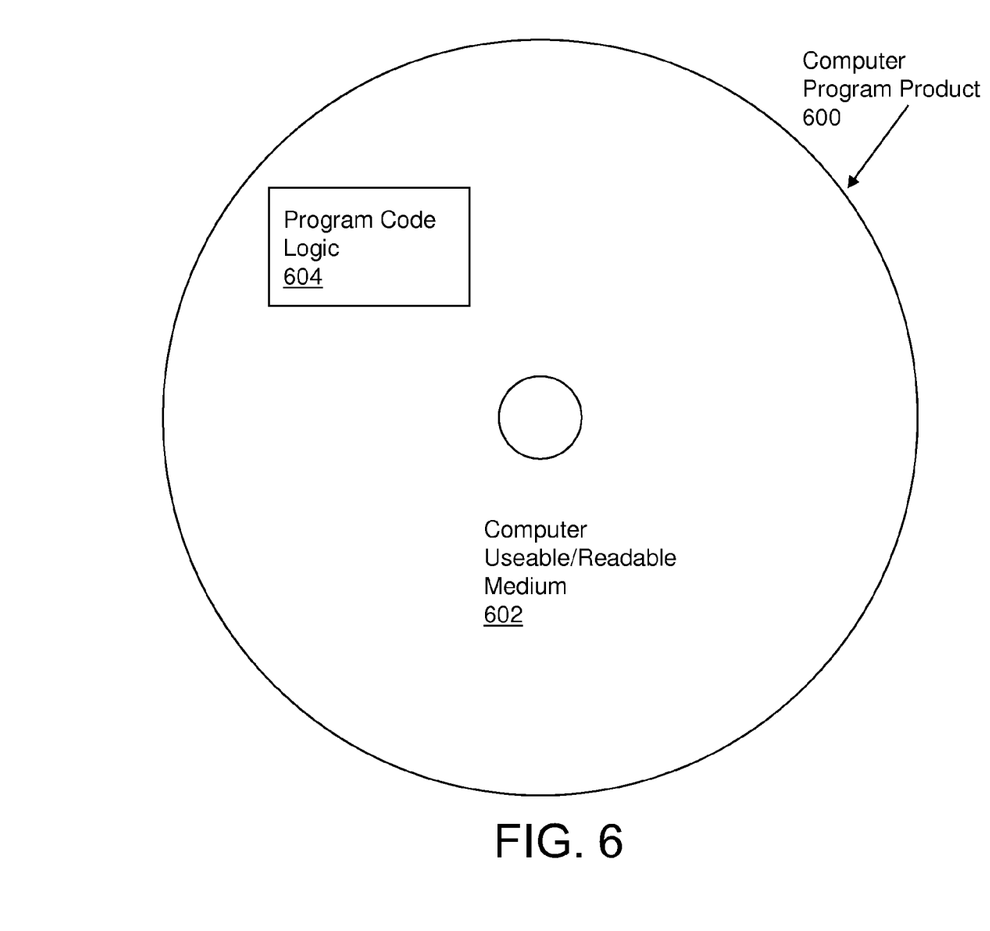
FIG. 6 illustrates a computer program product in accordance with an embodiment.

Referring to FIG. 6, one or more aspects of embodiments can be included in an article of manufacture (e.g., one or more computer program products 600) having, for instance, computer readable storage media 602. The media has embodied therein, for instance, computer readable program code (instructions) 604 to provide and facilitate the capabilities of embodiments. The article of manufacture can be included as a part of a computer system or as a separate product.

An embodiment may be a computer program product for enabling processor circuits to perform elements of the invention, the computer program product comprising a computer readable storage medium readable by a processing circuit and storing instructions for execution by the processing circuit for performing a method.

The computer readable storage medium (or media), being a tangible, non-transitory, storage medium having instructions recorded thereon for causing a processor circuit to perform a method. The "computer readable storage medium" being non-transitory at least because once the instructions are recorded on the medium, the recorded instructions can be subsequently read one or more times by the processor circuit at times that are independent of the time of recording. The "computer readable storage media" being non-transitory including devices that retain recorded information only while powered (volatile devices) and devices that retain recorded information independently of being powered (non-volatile devices). An example, non-exhaustive list of "non-transitory storage media" includes, but is not limited to, for example: a semi-conductor storage device comprising, for example, a memory array such as a RAM or a memory circuit such as latch having instructions recorded thereon; a mechanically encoded device such as punch-cards or raised structures in a groove having instructions recorded thereon; an optically readable device such as a CD or DVD having instructions recorded thereon; and a magnetic encoded device such as a magnetic tape or a magnetic disk having instructions recorded thereon.

A non-exhaustive list of examples of computer readable storage medium include the following: a portable computer diskette, a hard disk, a random access memory (RAM), a read-only memory (ROM), an erasable programmable read-only memory (EPROM or Flash memory), a portable compact disc read-only memory (CD-ROM). Program code can be distributed to respective computing/processing devices from an external computer or external storage device via a network, for example, the Internet, a local area network, wide area network and/or wireless network. The network may comprise copper transmission cables, optical transmission fibers, wireless transmission, routers, firewalls, switches, gateway computers and/or edge servers. A network adapter card or network interface card in each computing/processing device receives a program from the network and forwards the program for storage in a computer-readable storage device within the respective computing/processing device.

Computer program instructions for carrying out operations for aspects of embodiments may be for example assembler code, machine code, microcode or either source or object code written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable storage medium that can direct a computer, other programmable data processing apparatus, or other devices to function in a particular.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer system for built-in testing of an unused element on a semiconductor chip, the system comprising:
   the chip, comprising:
      a plurality of chip elements, the plurality of chip elements comprising a plurality of active elements, each active element enabled to perform a respective function, and at least one unused element comprising one of a masked element and a redundant element, the at least one unused element disabled from performing the respective function and configured to be selectively enabled as an active element; and
      a built-in self test (BIST) engine, the chip configured to perform a method comprising:
         concurrently performing the respective functions of the respective active elements and a BIST test of the at least one unused element by the BIST engine, the BIST test comprising:
            inputting an input test pattern to the unused element;
            receiving an output test pattern based on the input test pattern from the unused element;
            comparing the input test pattern to the output test pattern; and
            determining whether the unused element passed or failed the testing based on the comparison.

2. The computer system of claim 1, further comprising, based on determining that the unused element failed the testing and based on the unused element comprising the masked element, flagging the chip for replacement.

3. The computer system of claim 1, the method further comprising, based on determining that the unused element failed the testing and based on the unused element comprising the redundant element, masking the redundant element.

4. The computer system of claim 1, the method further comprising, based on determining that the unused element passed the testing and based on the unused element comprising the redundant element, configuring a first active element of the chip to be a redundant element, and configuring the redundant element to be a second active element to replace the first active element.

5. The computer system of claim 1, wherein determining whether the unused element passed or failed the testing based on the comparison comprises:
   determining an error rate for the unused element based on the comparison;
   determining that the unused element passed based on the error rate being lower than an error rate threshold, wherein the error rate threshold is determined based on whether the unused element comprises a redundant element or a masked element; and
   determining that the unused element failed based on the error rate being higher than the error rate threshold.

6. The computer system of claim 1, wherein determining whether the unused element passed or failed the testing based on the comparison comprises:
   determining an error rate for the unused element based on the comparison;
   comparing the error rate to a stored error rate that was determined during previous testing of the unused element to determine a rate of change of the error rate for the unused element;
   determining that the unused element passed based on the rate of change of the error rate being lower than a rate of change threshold, wherein the rate of change threshold is determined based on whether the unused element comprises a redundant element or a masked element; and
   determining that the unused element failed based on the rate of change of the error rate being higher than the rate of change threshold.

7. The computer system of claim 1, wherein the chip is a processor chip, and the plurality of chip elements are a plurality of processor cores.

8. The computer system of claim 1, wherein the chip is a memory chip in a cache memory of the computer system, and the plurality of chip elements are a plurality of memory arrays.

9. The computer system of claim 1, wherein the plurality of chip elements are divided into a plurality of test groups of chip elements, each test group comprising a respective BIST engine.

\* \* \* \* \*